United States Patent [19]

Kaiser

[11] Patent Number: 5,946,174
[45] Date of Patent: Aug. 31, 1999

[54] PROCESS FOR DETECTING A GROUND FAULT IN AN ELECTRIC POWER TRANSMISSION LINE

[75] Inventor: Steffen Kaiser, Berlin, Germany

[73] Assignee: Siemens Aktiengesellschaft, Munich, Germany

[21] Appl. No.: 08/817,449

[22] PCT Filed: Oct. 25, 1995

[86] PCT No.: PCT/DE95/01524

§ 371 Date: Jul. 21, 1997

§ 102(e) Date: Jul. 21, 1997

[87] PCT Pub. No.: WO96/13888

PCT Pub. Date: May 9, 1996

[30] Foreign Application Priority Data

Oct. 27, 1994 [DE] Germany .............................. 44 39 499

[51] Int. Cl.[6] .................................................... H02H 3/00
[52] U.S. Cl. ............................................. 361/47; 361/79
[58] Field of Search ................................... 361/42, 44–50, 361/54, 56, 57, 62, 63, 65, 76, 77, 78–80, 82, 84, 85–87; 364/483; 324/509, 512, 521–522, 525, 555, 558

[56] References Cited

U.S. PATENT DOCUMENTS

| 4,536,815 | 8/1985 | Li et al. ...................................... 361/47 |
| 4,559,491 | 12/1985 | Saha ......................................... 324/52 |

FOREIGN PATENT DOCUMENTS

| 0 079 504 | 5/1983 | European Pat. Off. ........ G01R 31/04 |
| 0 330 851 | 9/1989 | European Pat. Off. ......... H02H 3/16 |
| 40 26 799 A1 | 2/1992 | Germany ....................... G01R 19/25 |
| 2012505 | 7/1979 | United Kingdom ............. H02H 7/26 |
| WO/93/19507 | 9/1993 | WIPO .............................. H02H 3/16 |

OTHER PUBLICATIONS

H. Titze, "Fehler und Fehlerschutz in elektrischen Drehstromanlagen", 1953, 2. Band,Seite 48, No Month.
H. CLemens, K. Rothe, "Schutztechnik in Elektroenergiesystemen", 1991, Seite 211, No Month.
Aufsatz, "Erfassung hochohmiger Erdfehler" in der Zeitschrift ABB–Technik, Jan. 1990 EV ST 3.
R. Roeper, "Kurzschlussströme in Drehstromnetzen", 1984, 6. Auflage, Seiten 48 bis 53, No Month.

Primary Examiner—Ronald W. Leja
Attorney, Agent, or Firm—Kenyon & Kenyon

[57] ABSTRACT

The invention concerns a process for detecting a ground fault in an electric power transmission line with three phase conductors where, upon response of the protective device, a fault identification signal indicating a single-pole or multipole fault is generated by comparing currents and voltages with predefined limit values. To reliably distinguish not only between a single-pole and a multipole ground fault, but also to reliably determine the phase conductor affected by the ground fault in such a process, measured quantities, corresponding to the currents of the zero phase-sequence system and the negative phase-sequence system, are formed when no fault identification signal is present. In the event of a ground fault of one phase conductor, when the phase angle between the two measured quantities drops below a predefined limit phase angle, an auxiliary signal is generated. Another auxiliary signal is generated when the currents in the two other phase conductors drop below a fraction of the ground current. A logic circuit emits a fault identification signal indicating a ground fault of one of the phase conductors when both auxiliary signals are present.

6 Claims, 7 Drawing Sheets

PROCESS FOR DETECTING A GROUND FAULT IN AN ELECTRIC POWER TRANSMISSION LINE

BACKGROUND INFORMATION

The present invention is directed to a process for detecting ground faults that occur in an electric power transmission line that has a plurality of phase conductors. In particular, upon the response of a protective device, the currents and voltages from these conductors are monitored with respect to a plurality of threshold values. A fault identification signal is generated when at least one conductor current exceeds one of the threshold values or when at least one conductor voltage drops below another one of the threshold values. The fault indication signal is indicative of a single-pole or multi-pole fault.

Previously proposed systems of this type have been discussed, for example, by H. Titze, "Faults and Fault Protection in Three-Phase Power Systems", 1953 Vol. 2, p. 48, and by H. Clemens and K. Rothe, "Protection Methods in Electric Power Systems", 1991, p. 211. Disadvantages that are found in such previously proposed systems include an inability to reliably distinguish single-pole from multi-pole ground faults and an inability to pinpoint which phase conductor has experienced the detected fault.

SUMMARY OF THE INVENTION

An object of the invention is to provide a process for detecting a ground fault in an electric power transmission line making it possible not only to reliably distinguish between a single-pole and a multipole ground fault, but also to reliably determine the phase conductor(s) affected by the ground fault.

To achieve this object, a measured quantity corresponding to the current of the zero phase sequence system and another measured quantity corresponding to the current of the negative phase sequence system are formed according to this invention from the derived currents when a fault detection signal is not available. An auxiliary signal is generated in the case of a ground fault of one phase conductor when the phase angle between the two measured quantities is less than a predefined threshold phase angle. The currents derived from the currents in the other two phase conductors are monitored to detect whether each of these derived currents is less than a fraction of the measured ground current, and when the derived currents drop below the fraction of the ground current, another auxiliary signal is generated. The auxiliary signals are tested in a logic circuit, which emits a fault identification signal indicating the ground fault of one of the phase conductors when both auxiliary signals are present.

While the use (see article Detection of high-resistance ground faults in the journal "ABB Technik" 1/90) of negative and zero phase-sequence system components for a sensitive ground fault protection is well known, the components of such a protection are used for precisely determining the direction of the ground fault, i.e., to precisely determine whether a fault is upstream or downstream from a directional ground fault relay.

The basic advantage of the process according to this invention consists of the fact that upon response of the protective device due to a ground fault, the phase conductors having a ground fault can be very reliably determined. This is due to the fact that when a fault identification signal is not available, it is checked whether the phase angle between one measured quantity and the other measured quantity is below a predefined threshold phase angle. In addition to this criterion, it is also checked whether the currents in the other phase conductors are less than a fraction of the ground current detected; if both criteria are met, the auxiliary signals are generated. If both auxiliary signals are present, a fault identification signal identifying the ground fault of one of the phase conductors is emitted.

The invention is based on the fact, among others, that in a power transmission line with three phase conductors a criterion for phase selection in the event of a ground fault can be derived from the phase angle between a measured quantity corresponding to the current of the negative phase sequence system and another measured quantity corresponding to the current in the zero phase sequence system. "Negative phase-sequence system," "zero phase-sequence system," and "positive phase-sequence system" are defined here as, for example, in Short-circuit currents in three-phase networks by R. Roeper, 1984, 6th edition, pp. 48 through 53.

Figure 1:
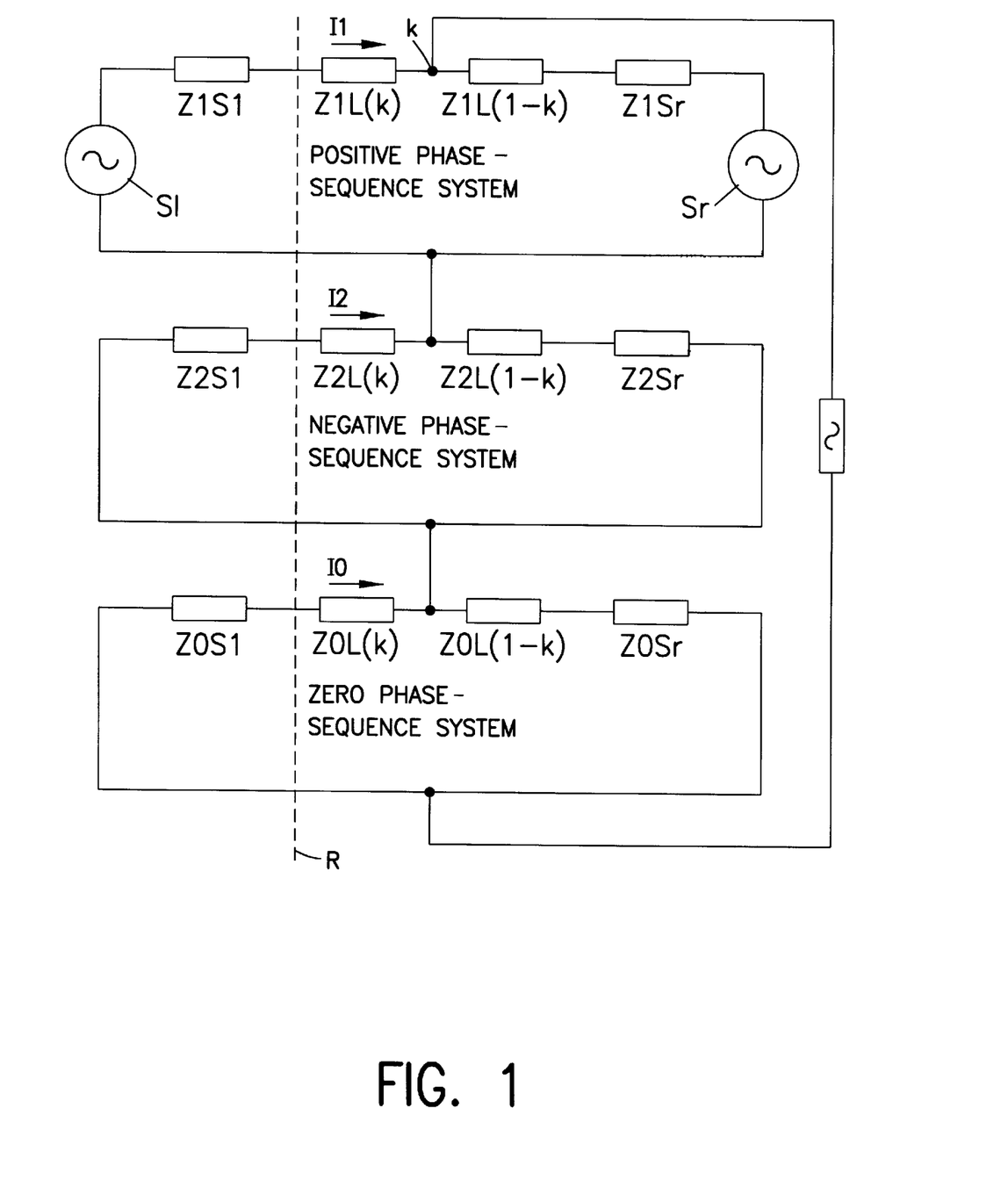
FIG. 1 shows an equivalent circuit of a three-phase electric power transmission line.
Figure 2:
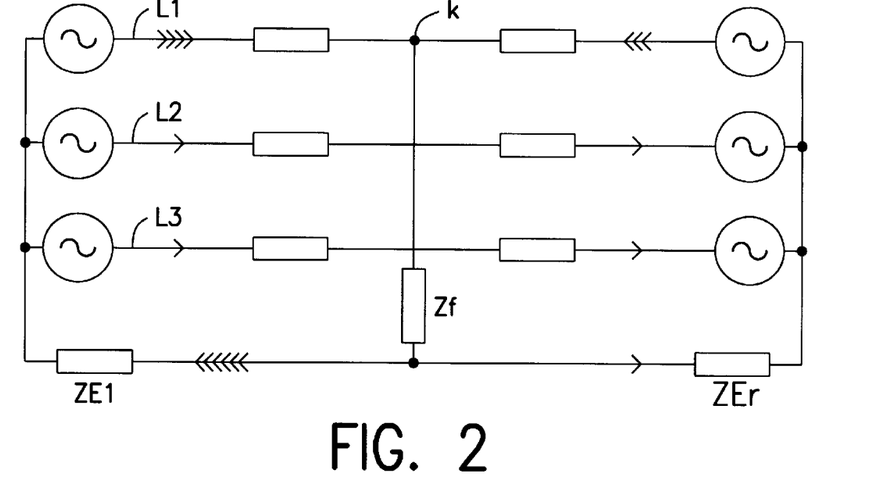
FIG. 2 shows another configuration of a three-phase electric power transmission line.
Figure 3:
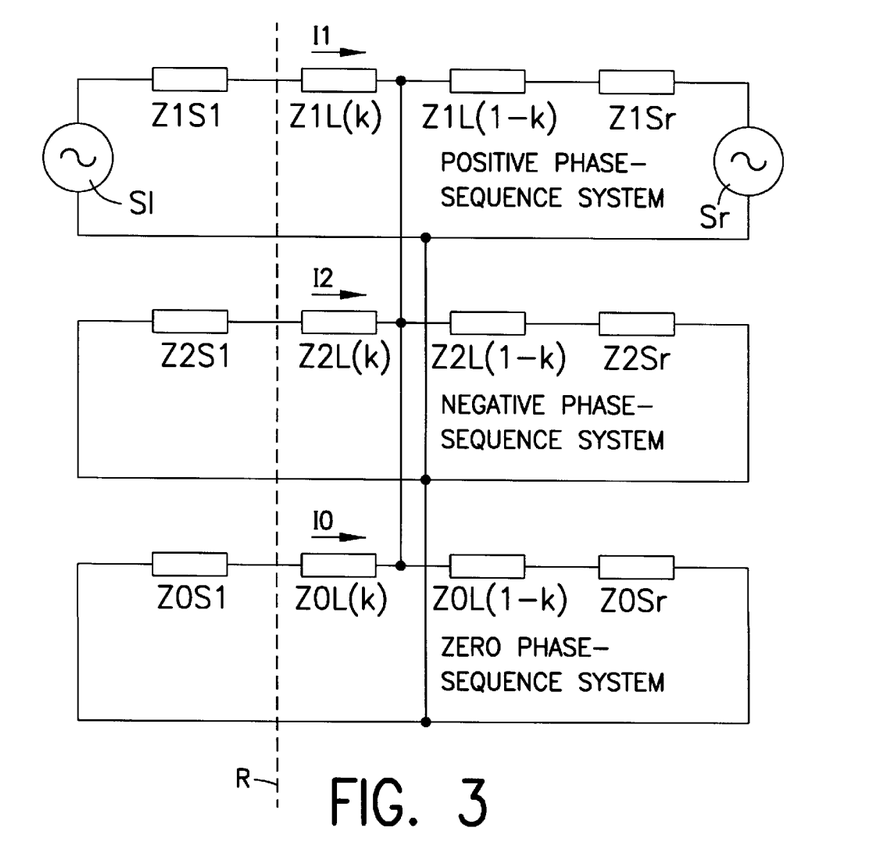
FIG. 3 shows an equivalent circuit having a double feed and a two-pole ground fault.

Taking this theoretical basis into account, the equivalent circuit of the three-phase electric power transmission line can be represented in symmetrical components with double feed and a single-pole ground fault in relation to a phase conductor L1 as shown in FIG. 1. The configuration shown in FIG. 2 serves as a basis, where a power transmission line with three phase conductors L1, L2, and L3 is fed from both ends and has a ground fault in relation to phase conductor L1 at point K. Zf denotes the fault impedance, while the (partial) ground impedances are denoted with ZE1 and ZEr. The number of arrows in the individual current branches of FIG. 2 denotes the different intensities of the respective currents. FIG. 3 shows an equivalent circuit with double feed and two-pole ground fault. In both figures S1 is a power source of the power transmission line and Sr is the second power source. Each of power sources S1 and Sr has an internal impedance, which is decomposed in the symmetrical component representations of FIGS. 1 and 2 into an impedance Z1sl in the positive phase-sequence system, another impedance Z2sL in the negative phase-sequence system, and impedance Z0sl in the zero phase-sequence system. Similarly, the impedances of the power source Sr in FIGS. 1 and 2 are denoted with Z1sr in the positive phase-sequence system, Z2sl in the negative phase-sequence system, and Z0sr in the zero phase-sequence system. The impedance of the power transmission line is given as Z1L(k) for an assumed fault or ground fault at point K in the positive phase-sequence system from point R where the relay is installed up to the location K of the fault, so that the value Z1L(1−k) is obtained for the impedance of the power transmission line from the fault point K to the second power source Sr in the positive phase-sequence system. The current in the positive phase-sequence system is denoted with I1.

FIGS. 1 and 3 further show that the corresponding power impedances in the negative phase-sequence system are denoted with Z2L(k) and Z2L(1−k), and the current in the negative phase-sequence system with I2. The current in the zero phase-sequence system is denoted with I0 in both FIGS. 1 and 2; it flows through impedance Z0L(k), which is supplemented by the second impedance Z0L(1−k) to form the line impedance in the zero phase-sequence system.

FIG. 1 also shows in detail that for a single-pole fault in phase conductor L1 of a power transmission line for zero current I0, the following equation (1) applies:

$$I0 = 3 \cdot I_f (\underline{Z}_{0L}(1-k) + \underline{Z}_{0Sr}) / (\underline{Z}_{0Sr} + \underline{Z}_{0Sl}(k) + \underline{Z}_{0Sr}) \quad (1)$$

where $I_f$ is the fault current.

The current (I2) of the negative phase-sequence system can be calculated according to the following equation (2)

$$I2 = 3 \cdot I_f (\underline{Z}_{2L}(1-k) + \underline{Z}_{2Sr}) / (\underline{Z}_{2Sr} + \underline{Z}_{2Sl}(k) + \underline{Z}_{2Sr}) \quad (2)$$

Since the impedances of the zero phase-sequence system and those of the negative phase-sequence system have approximately the same angle, the following equation (3) can be established for the phase angle φ(I0,I2) between the current I0 of the zero phase-sequence system and current I2 of the negative phase-sequence system:

$$\phi(\underline{I0}/\underline{I2}) \approx 0° \quad (3)$$

Figure 4:
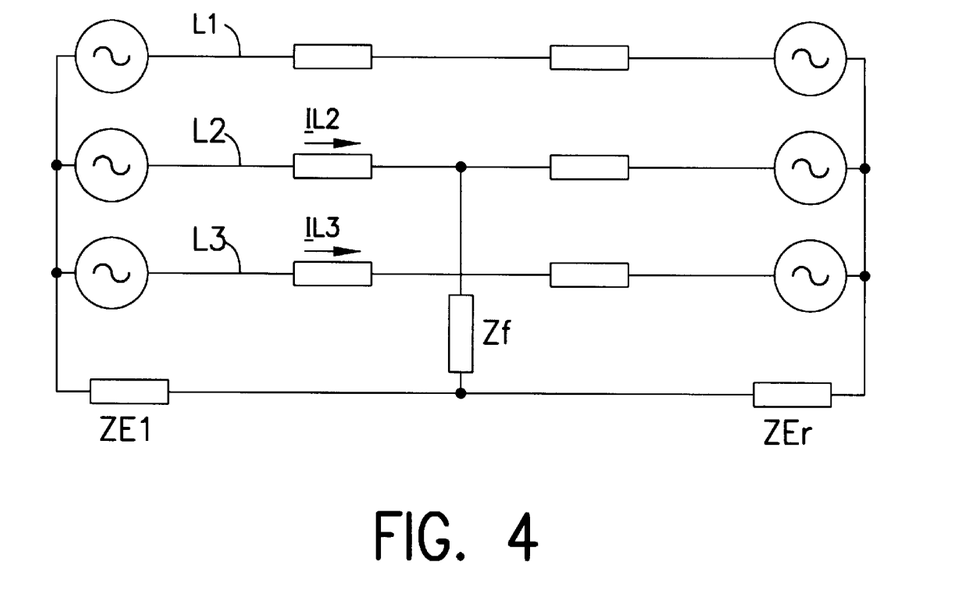
FIG. 4 shows another equivalent circuit having a two-pole ground fault.

For a two-pole ground fault of phase conductors L2 and L3 with the ground E, as shown in FIG. 4 in a manner similar to that of FIG. 2, the following equations (4) and (5) apply:

$$\underline{I0} = \underline{U}_{of}/(\underline{Z}_{0Sr} + \underline{Z}_{0L}(k)) \quad (4)$$

$$\underline{I2} = \underline{U}_{2f}/(\underline{Z}_{2Sr} + \underline{Z}_{2L}(k)) \quad (5)$$

In these equations (4) and (5), $U_{of}$ is the voltage of the zero phase-sequence system in the event of a fault, and $U_{2f}$ is the voltage of the negative phase-sequence system in the event of a fault. Since the negative phase-sequence system is connected in parallel with the zero phase-sequence system, the following equation applies:

$$U_{of} = U_{2f} \quad (6)$$

Hence, the following equation (7) also applies for a two-pole ground fault between phase conductors L2, L3, and the ground:

$$\phi(\underline{I0}/\underline{I2}) \approx 0° \quad (7)$$

This shows, in the first place, that no difference exists regarding the phase angle between currents I0 and I2 of the zero and negative phase-sequence systems for a single-pole ground fault of phase conductor L1 or for a two-pole ground fault between phase conductors L2, L3, and the ground, so that this criterion alone is insufficient to distinguish between the two types of fault.

Considering that currents I0 and I2 can be formed according to the following equations (9) and (10) with a=i−0.5+ j*0.87 and a²=−0.5−j*0.87:

$$\underline{I0} = \tfrac{1}{3} \cdot (\underline{I}L1 + \underline{I}L2 + \underline{I}L3) \quad (9)$$

$$\underline{I2} = \tfrac{1}{3} \cdot (\underline{I}L1 + a^2\underline{I}L2 + a\underline{I}L3) \quad (10)$$

The equations regarding the phase angle between current I0 of the zero phase-sequence system and current $I_2$ of the negative phase-sequence system can be easily calculated for the other possible cases of fault.

Thus, the following equation applies to a single-pole ground fault of phase conductor L2 for phase angle φ(I0/I2), (11), which also applies to a two-pole fault between phase conductors L1, L3, and ground E:

$$\phi(\underline{I0}/\underline{I2}) \approx 240° \quad (11)$$

For a single-pole fault of phase conductor L3 with the ground, and for a two-pole fault between phase conductors L1, L2, and ground E, the following equation (12) is obtained:

$$\phi(\underline{I0}/\underline{I2}) \approx 120° \quad (12)$$

If a measured quantity proportional to current I0 of the zero phase-sequence system and another measured quantity proportional to current I2 of the negative phase-sequence system are used for evaluation, then the following conclusions can be drawn from the previous discussions:

If the phase angle between the first measured quantity and the second measured quantity is approximately 0° for a single-pole or two-pole ground fault, then L2 and L3 are either not the two conductors involved in the single-pole ground fault of phase conductor L1, or they are the two conductors involved in a two-pole ground fault.

If the phase angle is approximately 120° for a single-pole or two-pole ground fault, then either phase conductors L1 and L2 are the two conductors not involved in the single-pole ground fault of phase conductor L3, or they are the two conductors involved in a two-pole ground fault.

If the phase angle between the two measured quantities is approximately 240° for a single-pole or two-pole ground fault, then L1 and L3 are either not the two conductors involved in the single-pole ground fault of phase conductor L2, or they are the two conductors involved in a two-pole ground fault.

If one of these situations arises, an auxiliary signal is generated.

For the situation described, an additional criterion is needed to reliably distinguish between a single-pole and a two-pole ground fault and, in addition, to reliably assign a single-pole ground fault to a certain phase conductor. This second criterion is obtained by examining currents of the two other phase conductors, e.g., L2 and L3 in regard to the phase conductor, e.g. L1, used for forming the first and second measured quantities. The currents derived from the currents flowing in these two phase conductors are monitored to determine whether each of these derived currents is less than a fraction of the detected ground current. This is based on the fact that for two-pole ground faults, two fault currents, with phase angles between 120° and 180° between them, flow through the two phase conductors involved in the fault. The intensity of these fault currents is at least $I_E/\sqrt{3}$.

Figure 5:
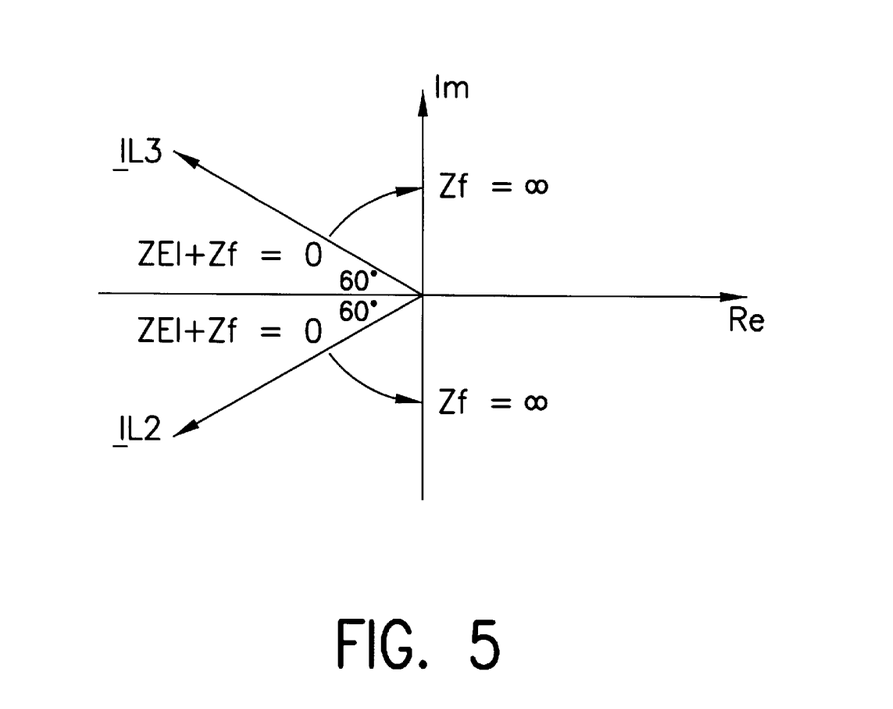
FIG. 5 shows a vector diagram that illustrates the dependence of the phase angles of the conductor currents on the impedance at the neutral point.

To elucidate this criterion, reference is made again to FIG. 4. For the assumed two-pole ground fault, currents IL2 and IL3 flow through phase conductors L2 and L3. If the impedance at the neutral point, formed by impedance Zf and partial impedance ZE1 of the ground is equal to zero, then both currents IL2 and IL3 are 120° apart. If the impedance at the neutral point increases, then these two currents are forced to flow back to the power source through their respective conductors, i.e., the phase angle between currents IL2 and IL3 increases to the limit value of 180°. The vector diagram of FIG. 5 shows this situation. Since ground current $I_E$ is formed by the two fault currents IL2 and IL3, the fault current must always be greater than or equal to $I_E/\sqrt{3}$. Thus, if both fault currents IL2 and IL3 are less than a predefined fraction of ground current $I_E$ as shown in the figure, then it can be concluded that no two-pole fault has occurred. In that case, another auxiliary signal generated indicates that a single-pole fault has occurred. Linking the second auxiliary signal with the first auxiliary signal in the logic circuit then allows a reliable conclusion to be drawn as to whether a single-pole fault is present in phase conductor L1 (in the case illustrated).

The second auxiliary signal, however, is not sufficient in all possible cases to reliably establish a single-pole fault in a certain phase conductor. Therefore it is considered advantageous in a refinement of the process according to the invention to monitor the currents derived from the other phase conductors to determine whether the phase angle between them is less than a predefined phase difference; a third auxiliary signal is generated if the phase angle drops below this phase difference, and the third auxiliary signal is checked by the logic circuit, which emits a fault identification signal indicating the ground fault of one of the phase conductors when the first and the second or the third auxiliary signal is present.

This additional criterion for obtaining a fault identification signal indicating the ground fault of a phase conductor L1 can be elucidated using FIG. 2. If, in this type of fault, the ground fault point is beyond the electric center of the arrangement illustrated in FIG. 2, then equalizing currents with the same phase angle will flow, since the impedances of phase conductors L2 and L3 are the same, and the current distribution rule applies. Thus, if the phase angle between the two currents flowing through the two other phase conductors L2 and L3 is approximately zero, this represents an additional criterion for a single-pole ground fault with equalizing currents.

Experience shows that, for ground faults that are particularly difficult to detect, namely ground faults under strong load effects, a fault identification signal is not generated even if both the above-mentioned criteria have been met. In this case it is advantageous to extract the load component from the currents flowing in the phase conductors. Since the current in the zero phase-sequence system and that in the negative phase-sequence system are not dependent on the load current, a load current correction is only performed to obtain an exact phase comparison. In this case, it is assumed that the load does not change after the occurrence of a ground fault. Since the load and fault currents are superimposed, the difference between the current flowing through a conductor after the occurrence of a ground fault and the current flowing through the same conductor prior to the occurrence of a ground fault gives the current caused by the ground fault.

According to another advantageous embodiment of the process according to the invention, when a fault identification signal is not generated, measured quantities of the current difference are formed by subtracting a derived current flowing in the respective phase conductor prior to the fault from the derived current. In the event of a ground fault of a phase conductor, a fourth auxiliary signal is generated when the phase angle between the two measured quantities drops below a predefined phase angle; the measured quantities of the current difference are monitored to determine whether each of these measured quantities of the current difference is below a fraction of the detected ground current. A fifth auxiliary signal is generated if the derived currents drop below the fraction of the ground current, and the fourth and fifth auxiliary signals are checked in a second logic circuit, which emits a fault signal identifying the ground fault of the first phase conductor when both of these auxiliary signals are present.

This embodiment of the process according to the invention, featuring load current correction, can be further refined by monitoring the measured quantities of the current difference of both other phase conductors to determine whether the phase angle between them is below a predefined phase difference. When the phase angle drops below that phase difference, a sixth auxiliary signal is generated, and the sixth auxiliary signal is checked in the second logic circuit, which emits a fault signal identifying the ground fault of the first phase conductor when the fourth and the fifth or the sixth auxiliary signal is present.

With this embodiment of the process according to the invention, all single-pole ground faults in a three-phase power transmission line can be determined securely and reliably. This also means that, when a fault signal is not present, it is a reliable sign that a multipole ground fault has occurred.

Figure 6:
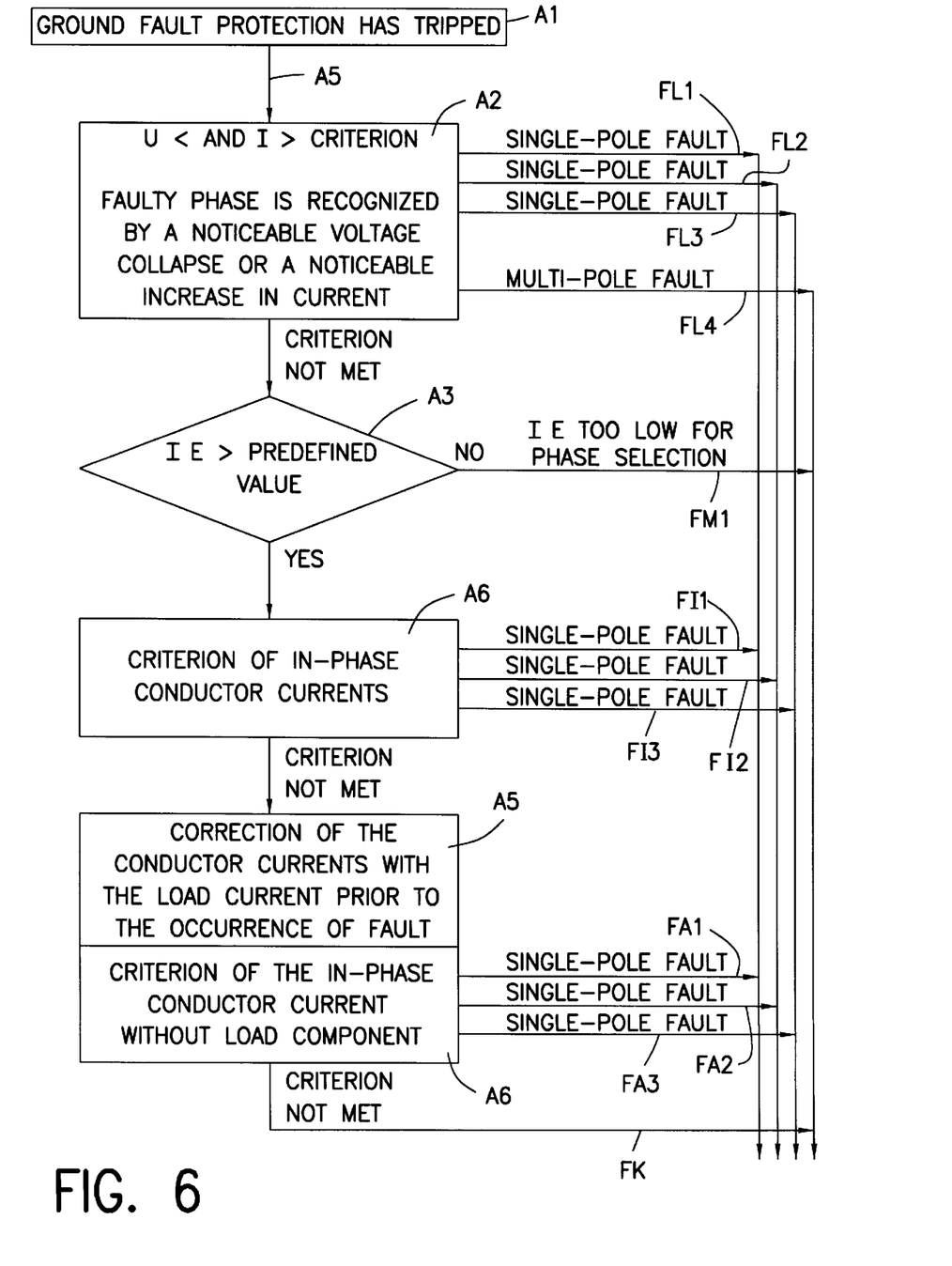
FIG. 6 shows a schematic flow chart explaining the basic steps of the process according to the invention.

The flow chart of FIG. 6 shows a first block A1, where an response signal AS of the protective device is generated if a ground fault occurs in a power transmission line to be monitored (not illustrated) with phase conductors L1 through L3. In addition to an response signal AS, it is checked in a downstream block A2 whether the current in one of phase conductors L1, L2, or L3 is above a predefined limit value or whether the voltage in one of conductors L1 through L3 has collapsed. If one or the other or both conditions are present, then a fault identification signal FL1, FL2, FL3, or FM is generated, showing a single-pole ground fault of phase conductors L1 through L3 or a multipole fault FM.

If none of the fault identification signals FL1 through FM is generated by block A2 despite its having received response signal AS, then it is checked in a downstream branch A3 whether the ground current $I_E$ detected is above a preselected value. If the ground current $I_E$ is relatively low, then it is considered a sign of a multipole fault; signal FM1 is generated. If ground current $I_E$ is greater than the predefined value, a subsequent block A4 is activated, by generating, through a plurality of auxiliary quantities, fault identification signals FI1 through FI3 indicating single-pole faults in phase conductors L1, L2, or L3, in a manner described in detail below.

If no fault identification signals FI1 through FI3 are generated, then another block A5 is activated, where the above-mentioned load current correction is initially performed. Then it is checked in a block A6, as it was in block A4, using auxiliary quantities, whether fault signals FA1 through FA3 can be generated. This then indicates single-pole ground faults in phase conductors L1, L2, or L3.

If none of fault signals FA1 through FA3 is generated, a fault signal FK is emitted, which indicates a multipole ground fault.

Figure 7:
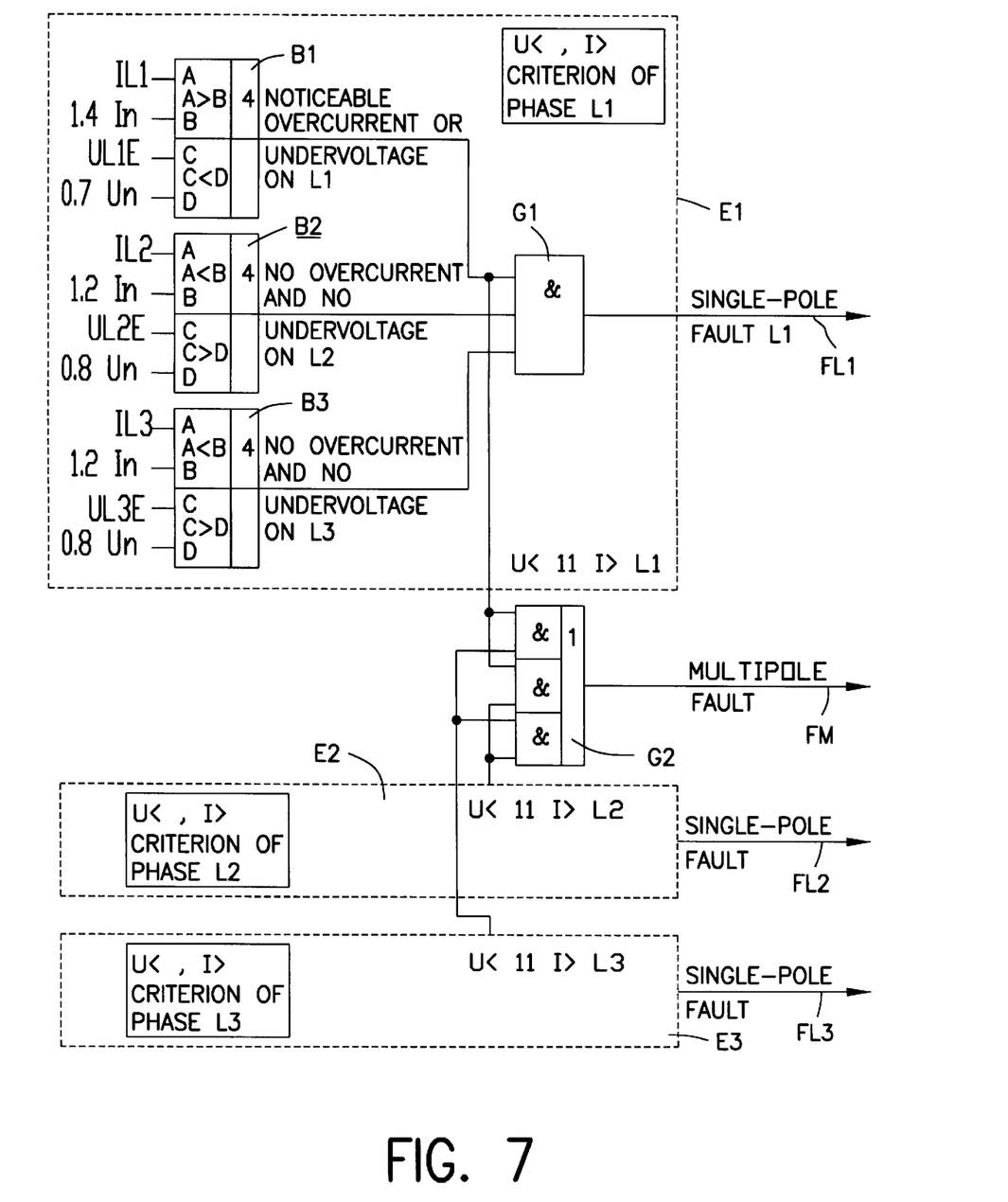
FIG. 7 shows a logic circuit advantageously used in the process according to the invention to monitor the phase currents and phase voltages for values higher or lower than certain limit values.

Block A2 of FIG. 6 can operate, for example, as shown in FIG. 7, which shows three blocks B1, B2, and B3, where currents IL1, IL2, and IL3 in individual phase conductors L1 through L3 of the three-phase power transmission line are monitored to determine whether limit values B are exceeded, with currents higher than rated current In are selected as limit values; in addition, phase voltages UL1E, UL2E, and UL3E are checked in phase conductors L1 through L3 to the ground to determine whether said voltages are below a limit value D, selected according to the rated voltage Un of the power transmission line. Via internal logic units of blocks B1 through B3, signals are sent to a downstream AND element G1, which generates a fault identification signal FL1 for a single-pole fault in phase conductor L1. Blocks B1 through B3, together with AND element 61, form a detection unit E1.

Similarly, other detection units E2 and E3, emitting fault identification signals FL2 and FL3 at their outputs in response to the corresponding ground faults, are provided to detect a single-pole ground fault in phase conductors L2 and L3. Like block B1, also the corresponding blocks of detection units E2 and E3 are connected at their outputs to a logic element G2, which emits a fault identification signal FM for a multipole fault. A multipole fault can also be identified using a logic arrangement L.

Figure 8:
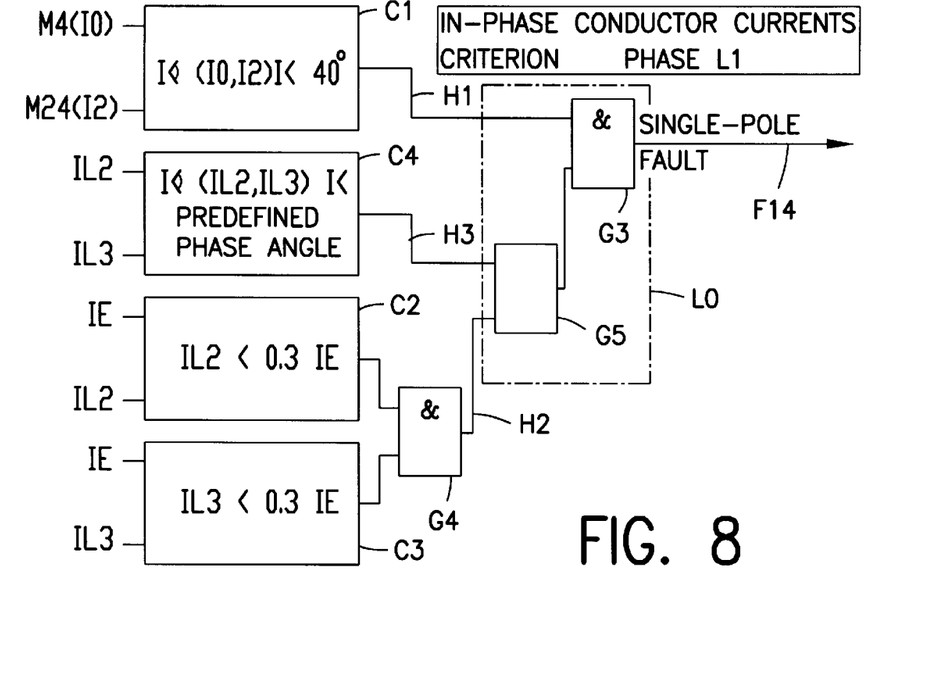
FIG. 8 shows a block diagram of an arrangement for detecting a single-pole fault in a phase conductor L1.

The circuit that implements block A4 for monitoring phase conductor L1 for a ground fault is shown in FIG. 8. A Block C1 receives a measured quantity M1 corresponding to the current I0 of the zero phase-sequence system and another measured quantity M2 corresponding to the current I2 of the negative phase-sequence system, each of which is formed as explained previously. The phase angle between currents I0 and I2 is determined in block C1, and it is checked whether the phase angle is less than 60°. If this is the case, block C1 emits an auxiliary signal H1, which is supplied to an AND element G3 of a logic circuit L0.

The arrangement of FIG. 8 also has a block C2 and another block C3, which receives, at its input, a quantity $I_E$ proportional to the ground current, and quantities proportional to current IL2 in phase conductor L2 and to current IL3 in phase conductor L3. If currents IL2 and IL3 are less than, for example, $0.3*I_E$ (a fraction of the measured ground current $I_E$), then another auxiliary signal H2 is generated by an AND element G4 and forwarded to an OR element G5 of logic circuit L0.

Another block C4 of the arrangement according to FIG. 8 receives currents IL2 and IL3 formed in phase conductors L2 and L3, and forms the phase angle between these two currents. If the phase angle is smaller than a predefined relatively small phase angle, an additional auxiliary signal H3 is generated and supplied to an input of OR element G5.

Thus, if auxiliary signal Hi and auxiliary signal H2, or auxiliary signal H3 are present, then a fault identification signal FI1 is emitted by AND element G3, indicating single-pole ground fault in phase conductor L1.

As explained previously, in some cases block C4 and OR element G5 are not needed for generating fault identification signal FI1.

Figure 9:
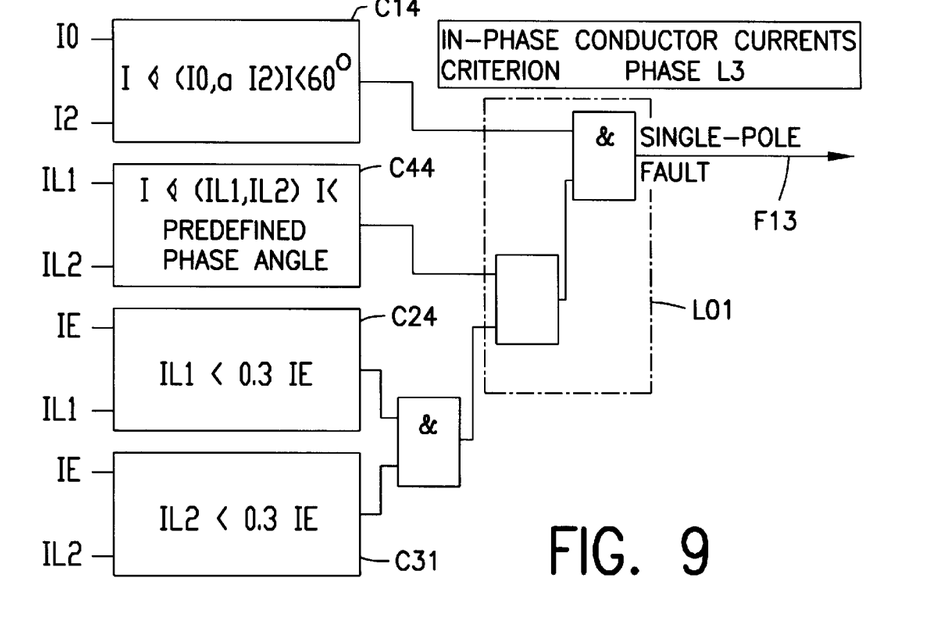
FIG. 9 shows a block diagram of an arrangement for detecting a single-pole ground fault in a phase conductor L3.
Figure 10:
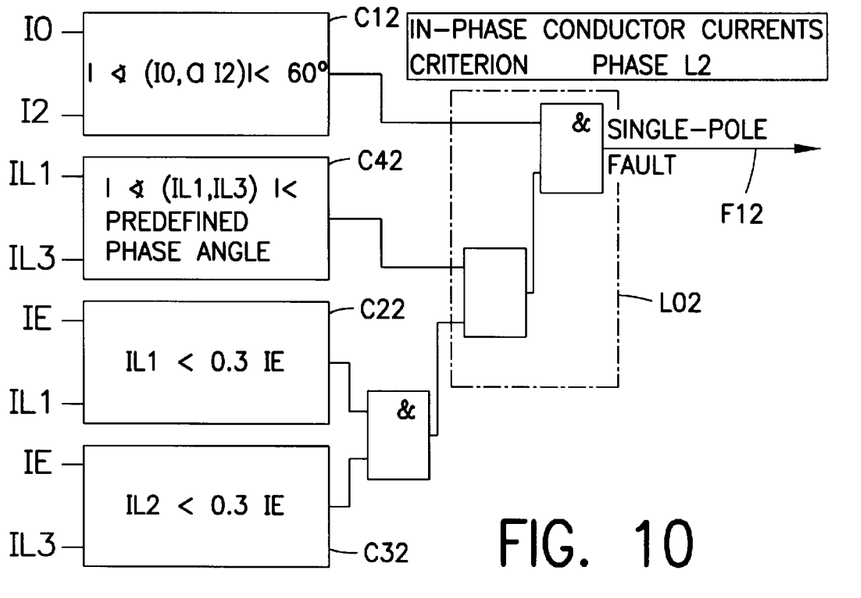
FIG. 10 shows another block diagram of an arrangement for detecting a single-pole ground fault in a phase conductor L2.

The arrangements of FIGS. 9 and 10 operate in a manner similar to that of FIG. 8, except that there instead of current I2 of the negative phase-sequence system, a current aI2, whose phase is rotated 120°, or a current $a^2I2$, whose phase is rotated 240° in relation to current I2 of the negative phase-sequence system, is used for phase comparison in blocks C11 and C12, and that blocks C21 through C41 of FIG. 9 and blocks C22 through C42 of FIG. 10 receive accordingly different input currents. Otherwise the arrangements of FIGS. 9 and 10 operate as that of FIG. 8, so that a ground fault identification signal FI3 indicating a ground fault in phase conductor L3 can be generated at the output of a logic circuit L01 with the arrangement of FIG. 9, and a ground fault identification signal FI2 indicating a ground fault in phase conductor L2 can be generated at the output of a logic circuit L02 with the arrangement of FIG. 10.

Figure 11:
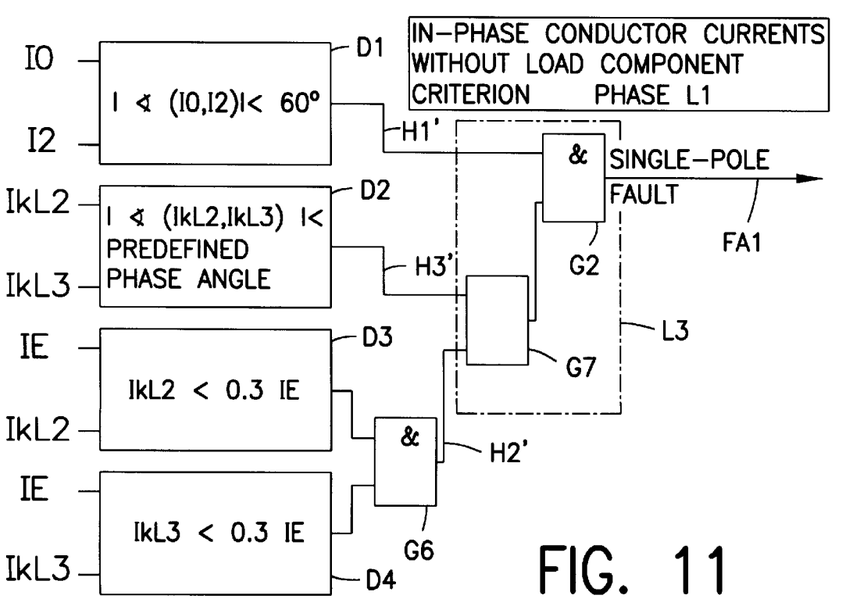
FIG. 11 shows another block diagram for detecting a single-pole ground fault in a phase conductor L1 with load current correction.

The arrangement of FIG. 11 basically corresponds to that of FIG. 8; one difference consists of the fact that, in the arrangement of FIG. 11, a block D2 receives at its input currents IkL2 and IkL3, obtained from the load current correction, in addition to a block D1, which corresponds to block C1 of FIG. 8. This means that current IkL2 is obtained from the following equation (13):

$$\underline{I}_{kl2}(t)=\underline{I}L2(t)-\underline{I}L2(t-t_s)\cdot e^{j\omega(t-ts)} \tag{13}$$

In this equation (13), $t_s$ denotes a point in time prior to the occurrence of the fault, while t denotes a point in time when a current is detected after the occurrence of the ground fault. Current IkL3 is obtained in a similar manner from the equation (14):

$$\underline{I}_{kl3}(t)=\underline{I}L3(t)-\underline{I}L3(t-t_s)\cdot e^{j\omega(t-ts)} \tag{14}$$

The corrected currents IkL2 and IkL3 are similarly further processed and compared to fractions of the ground currents in blocks D3 and D4.

If a fourth auxiliary signal H1' is present at the output of block D1, a fifth auxiliary signal H2' is present at the output of an AND element G6, and a sixth auxiliary signal H3' is present at the output of block D2, then an AND element GB is caused to emit a fault signal FA1 via an OR element G7 of an additional logic circuit SL, which indicates a single-pole fault in phase conductor L1.

Exactly as described previously in connection with the explanation of block A4 according to FIG. 6, block A6 also contains a total of three circuits corresponding to the arrangement of FIG. 11, so that, in addition to fault signal FA1, the other fault signals FA2 and FA3 can also be obtained. As in FIGS. 9 and 10, the corresponding phase angles and corresponding currents are taken into account.

What is claimed is:

1. A method of detecting a ground fault in an electric transmission line having a plurality of phase conductors, comprising the steps of:
   a) monitoring, upon response of a protective device, a plurality of currents corresponding to the plurality of phase conductors to determine if any of the plurality of currents exceeds a first limit value;
   b) monitoring, upon response of the protective device, a plurality of voltages corresponding to the plurality of phase conductors to determine if any of the plurality of voltages becomes less than a second limit value;
   c) generating a fault identification signal when at least one of the plurality of currents exceeds the first limit value, wherein the fault identification signal indicates one of a single-pole and a multipole fault; and d) generating the fault indication signal when at least one of the plurality of voltages becomes less than the second limit value, wherein, when no fault indication signal is present:
  i) a first measured quantity corresponding to a current in a zero phase-sequence system is formed from the plurality of currents,
  ii) a second measured quantity corresponding to a current in a negative phase-sequence system is formed from the plurality of currents,
  iii) a first auxiliary signal is generated in the event of a ground fault in one of the plurality of conductors when a phase angle between the first measured quantity and the second measured quantity becomes less than a predetermined limit phase angle,
  iv) the currents corresponding to the remaining conductors of the plurality of conductors are monitored to determine whether any one of the currents corresponding to the remaining conductors is less than a fraction of a detected ground current,
  v) a second auxiliary signal is generated when the currents corresponding to the remaining conductors become less than the fraction of the ground current, and
  vi) the first auxiliary signal and the second auxiliary signal are checked in a logic circuit, the logic circuit emitting the fault identification signal indicating the ground fault in the one of the plurality of conductors when the first auxiliary signal and the second auxiliary signal are present.

2. The method according to claim 1, wherein a third auxiliary signal is generated when a phase angle between the currents corresponding to the remaining conductors of the plurality of conductors is below a predetermined phase difference, and wherein the third auxiliary signal is checked in the logic circuit, the logic circuit generating the fault indication signal when one of the first and second auxiliary signals and the third auxiliary signal is present, the fault indication signal indicating the ground fault of the one phase conductor.

3. The method according to claim 2, wherein, when no fault indication signal is present, a plurality of measured quantities of current differences is formed, the current differences being formed by subtracting from each of the plurality of currents, in relation to each conductor, a derived current corresponding to the current flowing prior to the ground fault, wherein in the event of the ground fault, a fourth auxiliary signal is generated when the phase angle between the first measured quantity and the second measured quantity becomes less than the predetermined limit phase angle, wherein a fifth auxiliary signal is generated when the measured quantities of the current differences become less than a fraction of the detected ground current, and wherein the fourth auxiliary signal and the fifth auxiliary signal are checked in a second logic circuit, the second logic circuit emitting a fault signal indicating the ground fault when the fourth auxiliary signal and the fifth auxiliary signal are present.

4. The method according to claim 1, wherein, when no fault indication signal is present, a plurality of measured quantities of current differences is formed, the current differences being formed by subtracting from each of the plurality of currents, in relation to each conductor, a derived current corresponding to the current flowing prior to the ground fault, wherein in the event of the ground fault, a fourth auxiliary signal is generated when the phase angle between the first measured quantity and the second measured quantity becomes less than the predetermined limit phase angle, wherein a fifth auxiliary signal is generated when the measured quantities of the current differences become less than a fraction of the detected ground current, and wherein the fourth auxiliary signal and the fifth auxiliary signal are checked in a second logic circuit, the second logic circuit emitting a fault signal indicating the ground fault when the fourth auxiliary signal and the fifth auxiliary signal are present.

5. The method according to claim 4, wherein a sixth auxiliary signal is generated when a phase angle between the measured quantities of the current differences corresponding to the remaining conductors of the plurality of conductors becomes less than a second predetermined difference, and wherein the sixth auxiliary signal is checked in the second logic circuit, the second logic circuit emitting the fault signal indicating the ground fault when one of the fourth and fifth auxiliary signals and the six auxiliary signals is present.

6. The method according to claim 5, wherein the second logic circuit checks whether the fault signal indicating the ground fault is present, a fault signal indicating a three-pole ground fault being generated when the fault signal indicating the ground fault is not present.

* * * * *